United States Patent [19]

Challen

[11] 4,351,032
[45] Sep. 21, 1982

[54] FREQUENCY SENSING CIRCUIT

[75] Inventor: Richard F. Challen, Lynchburg, Va.

[73] Assignee: General Electric Company, Lynchburg, Va.

[21] Appl. No.: 161,563

[22] Filed: Jun. 20, 1980

Related U.S. Application Data

[63] Continuation-in-part of Ser. No. 965,897, Dec. 4, 1978, abandoned.

[51] Int. Cl.³ .............................................. G06F 7/38
[52] U.S. Cl. .................................... 364/724; 328/138
[58] Field of Search ................ 364/724; 328/138, 140, 328/167; 340/171 R; 179/1 D; 324/78 D, 78 F, 78 J

[56] References Cited

U.S. PATENT DOCUMENTS

| | | | |
|---|---|---|---|
| 3,543,012 | 11/1970 | Courtney | 364/724 |
| 3,550,017 | 12/1970 | Whalen | 328/110 |
| 3,639,739 | 2/1972 | Golden et al. | 364/724 |
| 3,663,885 | 5/1972 | Stewart | 328/140 |
| 3,803,390 | 4/1974 | Schaepman | 364/724 |
| 3,934,097 | 1/1976 | Carbrey | 328/138 |
| 3,962,645 | 6/1976 | Stewart | 328/138 |
| 3,997,770 | 12/1976 | Claasen et al. | 364/724 |
| 4,021,653 | 5/1977 | Sharp et al. | 364/724 |
| 4,047,114 | 9/1977 | Lane et al. | 328/140 |
| 4,216,463 | 8/1980 | Backof, Jr. et al. | 364/724 |

FOREIGN PATENT DOCUMENTS

| | | |
|---|---|---|
| 1276418 | 6/1972 | United Kingdom. |
| 1303417 | 1/1973 | United Kingdom. |
| 1406086 | 9/1975 | United Kingdom. |

OTHER PUBLICATIONS

Advanced Micro Devices–Digital Signal Processing Handbook Copyright 1976 by Advanced Micro Devices, Inc.–Digital Filter Design by J. R. Mick, pp. 12-18.
Digital Processing of Signals by G. Rader, pp. 21-25.
IEEE Transactions Audio & Electro Acoustics, AV-16, No. 3, Sep. 1968, pp. 318-319.

Primary Examiner—Charles E. Atkinson
Attorney, Agent, or Firm—Cushman, Darby & Cushman

[57] ABSTRACT

A digital circuit for sensing a frequency component $F_0$ in an applied signal. The amplitude of an input signal is sampled at a clock rate that is N times $F_0$ and each amplitude sample is encoded as a digital word. The digital words are applied to a first input of an adder, and digital feedback words are applied to a second input of the adder. The output of the adder is applied to a delay circuit which delays the adder output an integral multiple of one-half of the period $T_0$ corresponding to frequency $F_0$. The delayed words are multiplied by a constant K whose magnitude is less than one and greater than zero. The delayed and multiplied words are applied as the feedback words to the second input of the adder in phase with the encoded words applied to its first input. A circuit output signal is derived from the adder output, or from the delay circuit output. This circuit output signal has a magnitude indicative of the frequency of the input signal with respect to the clock frequency, and its magnitude is greatest when the input signal frequency is equal to the clock frequency divided by N. The bandwidth of the circuit is adjusted by changing multiplier constant K which is programmable by external signals. Means are provided for adjusting the scale of the digital words applied to the first input of the adder to compensate for changes in K as they occur.

49 Claims, 6 Drawing Figures

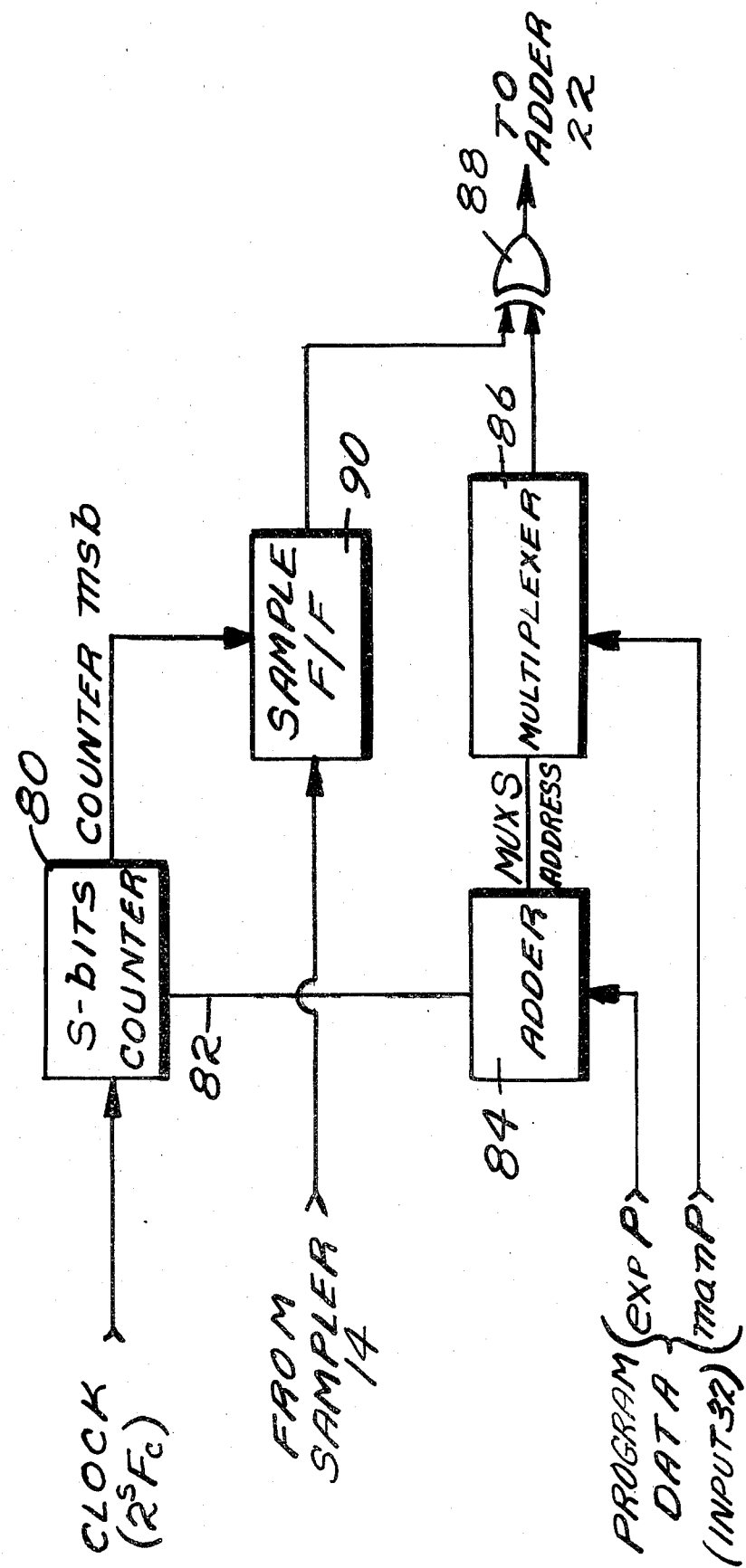

FREQUENCY SENSING CIRCUIT

This is a continuation-in-part of application Ser. No. 965,897 which was filed on Dec. 4, 1978, now abandoned.

BACKGROUND OF THE INVENTION

This invention relates in general to digital filters. More specifically, this invention relates to digital filters utilized for tone encoding and tone detecting in communications systems.

Digital frequency sensing circuits and filters are being widely used to replace their analog counterparts because of their relatively small size, high temperature stability, and uniformity in mass production. These characteristics are particularly desirable when frequency sensing circuits are used for detecting relatively low frequencies such as audio frequencies. Analog circuits require the use of relatively large inductors and capacitors at such frequencies. Furthermore, relatively large analog component are not usually manufactured within tolerances required and must therefore be individually tested and adjusted, a procedure that is expensive. In addition, large analog components are subject to an unacceptable level of temperature drift.

SUMMARY OF THE INVENTION

Accordingly, there is provided a new and improved digital frequency sensing circuit having a simpler configuration than previously known digital frequency sensing circuits.

The frequency sensing circuit according to the present invention can be operated as a bandpass filter, and can be programmed easily to sense substantially any center frequency desired. It operates substantially as follows.

Signals to be filtered are amplitude sampled. This sampling occurs at a frequency that is N times the frequency to be sensed, where N is any integer that is equal to or greater than two (2). These amplitude samples are quantized and encoded by an encoder into digital encoded words EW having a desired scale and level of resolution. These digital words EW are applied to a first signal input of a digital adder, and digital feedback words are applied to a second input of the digital adder. The digital adder's output words AW are applied to a delay circuit which delays its input by an integral multiple of one-half of the period of the frequency to be sensed. The delayed digital words DW are multiplied by a constant K whose magnitude is less than one (1) to form delayed and multiplied words MW. The value of K determines the bandwidth (related "Q") of the circuit. The delayed and multiplied words MW are applied as the feedback words to the second signal input of the digital adder. The output signal of the frequency sensing circuit is taken either at the output of the digital adder or at the output of the delay circuit, and will have a magnitude that is a maximum when the frequency of the input signal to the frequency sensing circuit is 1/N times the sampling frequency.

The multiplier constant K is programmable in response to a programming signal (program data). This programming signal has components manP and expP, where $P = K + 1$ and $P = \text{manP} \times 2^{-\text{expP}}$. The manP and expP signals are also applied to the encoder so that the scale of the encoded words coupled to the first adder input is automatically adjusted to compensate for scale changes that would otherwise occur when the bandwidth of the frequency sensing circuit changes as K is changed.

BRIEF DESCRIPTION OF THE DRAWINGS

Many of the attendant advantages and features of the present invention will be readily apparent as the invention becomes better understood by reference to the following detailed description along with the appended claims when considered in conjunction with the accompanying drawings wherein:

FIG. 6 is a schematic diagram of the encoder block shown in FIG. 1.

DESCRIPTION OF THE PREFERRED EMBODIMENT

Figure 1:
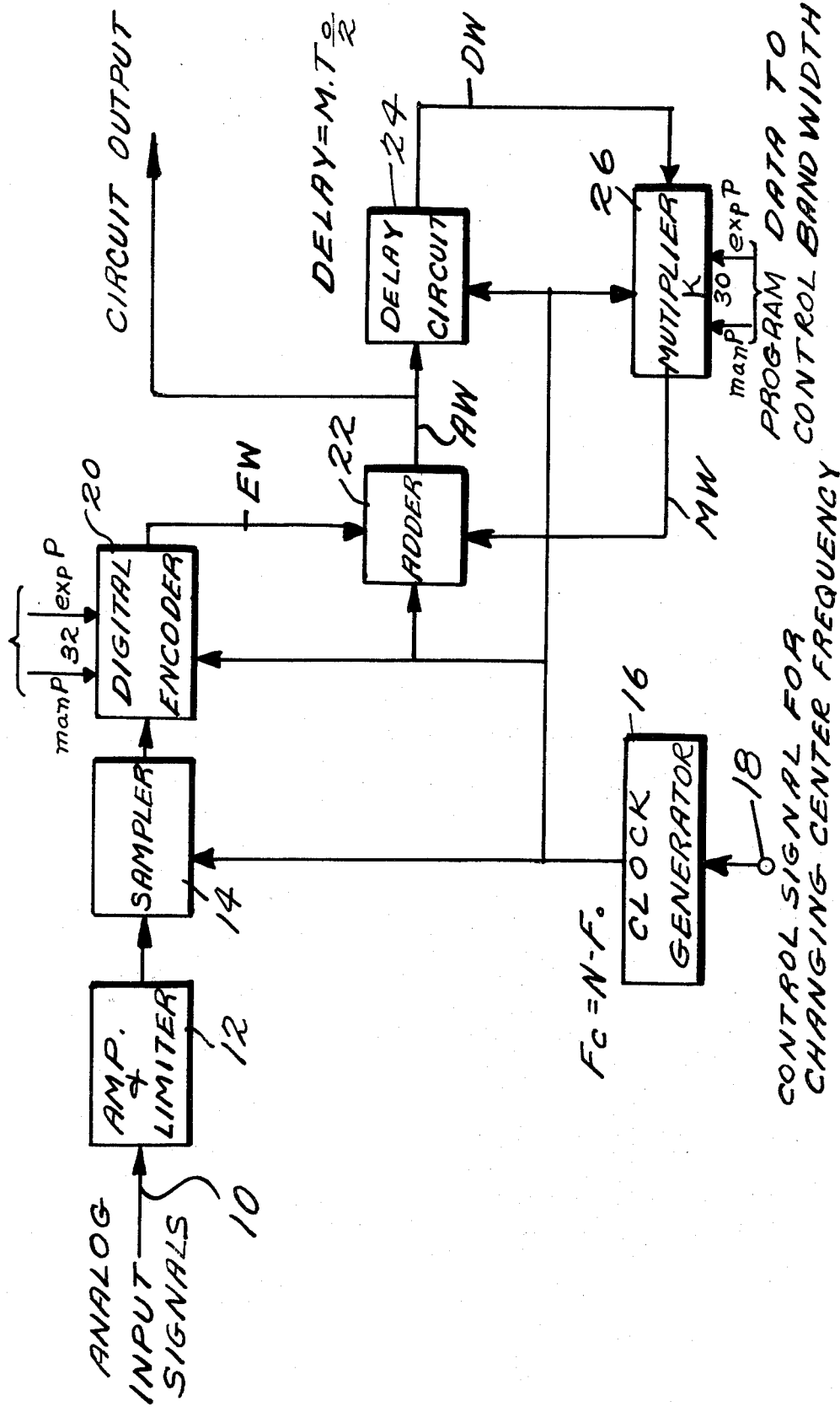
FIG. 1 is a block diagram of the frequency sensing circuit according to the present invention.

Referring now to the drawings, wherein like reference numerals designate like or corresponding parts throughout, a general block diagram of the frequency sensing circuit according to the present invention is shown in FIG. 1.

It is assumed that one or more audio tones or sine wave signals may be received by circuits "ahead of" the frequency sensing circuit and coupled to its input, and that it is desirable to sense or detect a particular tone frequency $F_0$. These tones or signals are applied to an input terminal 10 which is coupled to an amplifier and limiter 12. The amplifier and limiter 12 converts the analog form of the input signals into substantially square or rectangular wave signals having the same frequency as the analog input signal. These amplified and limited signals are applied to an amplitude sampler 14 which provides amplitude samples of the amplified and limited signals. The time duration of and interval between these samples is under the control of a clock generator 16 whose frequency $F_C$ is set by a clock control signal applied to a terminal 18. Clock generator 16 produces clock signals (control pulses) at a frequency $F_C$ which is a rate that is N times the frequency $F_0$ desired to be sensed. N may be any integer that is equal to or greater than two (2). For example, if the frequency $F_0$ to be sensed is 300 Hertz, clock generator 16 would produce clock pulses at a frequency $F_C$ of at least 600 Hertz. For good results, N is preferably at least 4, so that for a frequency $F_0$ of 300 Hertz, the control pulses would have a frequency $F_C$ of 1200 Hertz. Thus, sampler 14 would provide amplitude samples at a rate of 1200 Hertz (1200 samples/sec.). Clock generator 16 provides control pulses to other circuit blocks so as to synchronize and control all digital operations.

The amplitude samples from sampler 14 are applied to a digital encoder 20 which converts the amplitude of each of the samples to a digitally encoded word EW. Because of the limiting provided by amplifier and limiter 12, the amplitude samples have only two levels, so that only one digital significant number is needed to characterize each sample. If an amplifier and limiter are not used, the encoder words EW may represent more significant quantization levels (for example 4, 8, 16, and so on in binary form), depending upon the resolution desired in the remainder of the circuit. For example, if a digital word has 16 binary digits, then $2^{16}$ or 65,536 different values or quantization levels could be represented in binary form. One of the bits forming each such word represents the sign of the sample. For the purpose of this presently preferred exemplary embodiment it is assumed that the bits are in parallel, so that no high speed serial signals are needed for the digital encoder and certain other parts of the circuit. However, serial data lines and a high speed clock could be used as an alternative arrangement to the configurations presented and their use is intended to be within the scope of the appended claims.

The scale of the encoded words EW is controlled by program data applied to a scale control input 32 of digital encoder 20. This program data includes a manP signal and an expP signal as will be more fully discussed hereinafter.

The digital words EW from encoder 20 are applied to a first signal input of a digital adder 22. The output added words AW from digital adder 32 are applied to a feedback circuit consisting only of a delay circuit 24 and a multiplier circuit 26 coupled in series in either order between the output of digital adder circuit 22 and a second signal input of the digital adder.

Delay circuit 24 delays the added words AW from digital adder 22 by an integral multiple of one-half the time period $T_0$ corresponding to frequency $F_0$ to be sensed. As known, $T_0$ equals $1/F_0$. Or expressed mathematically, the delay is equal to $MT_0/2$ where M is any integer. If, as preferred, delay circuit 24 utilizes some type of digital shift register, it is provided with clock signals from clock generator 16. If a digital shift register is used for providing delay, the delay provided is MN/2 digital words, where M and N are as defined above. However, if the delay circuit is of some other type, clock signals may not be needed. Output words DW from delay circuit 24 are fed back through a digital multiplier 26 to the second signal input of digital adder 22. Multiplier 26 multiplies the delayed digital words DW by a multiplier constant K whose magnitude is less than one (1) but greater than zero (0) to produce delayed and multiplied words MW, the value of K depending upon the desired circuit bandwidth (related to "Q"). The magnitude of the multiplier constant K determines the Q of the sensing circuit according to the relation $$\frac{90°}{\arctan \frac{1-|K|}{1+|K|}}.$$

A program data input 30 to multiplier 26 is provided for controlling the value of K. The program data applied to input 30 of multiplier 26 includes manP and expP signals, as will be further discussed hereinafter. As K is varied to alter the bandwidth of the circuit, the scale of encoder 20 must be changed to compensate the signal level of encoded words EW. This is accomplished by program data coupled to scale control input 32 thereto.

In the feedback circuit, the sign of the delayed and multiplied words MW applied to the second signal input of adder circuit 22 is determined by the integer M used in delay circuit 24. If M is an odd integer, the sign of the fed back words must be minus; if M is an even integer, the sign of the fed back words must be plus. Or, expressed in another way, the phase of each delayed and multiplied word MW applied to the adder circuit 22 must be the same as the phase of the encoded word EW that is simultaneously applied to adder circuit 22 at the resonant frequency $F_0$. Adder circuit 22 adds the encoded words EW and the feedback words (delayed and multiplied words MW) from multiplier 26 and provides the sum of these words as adder words AW. Adder circuit 22, delay circuit 24, and multiplier 26 should be able to handle the number of significant digits needed for desired circuit accuracy. Output signals from the frequency sensing circuit may be derived from the output of adder circuit 22 or from the output of delay circuit 24.

Figure 2:
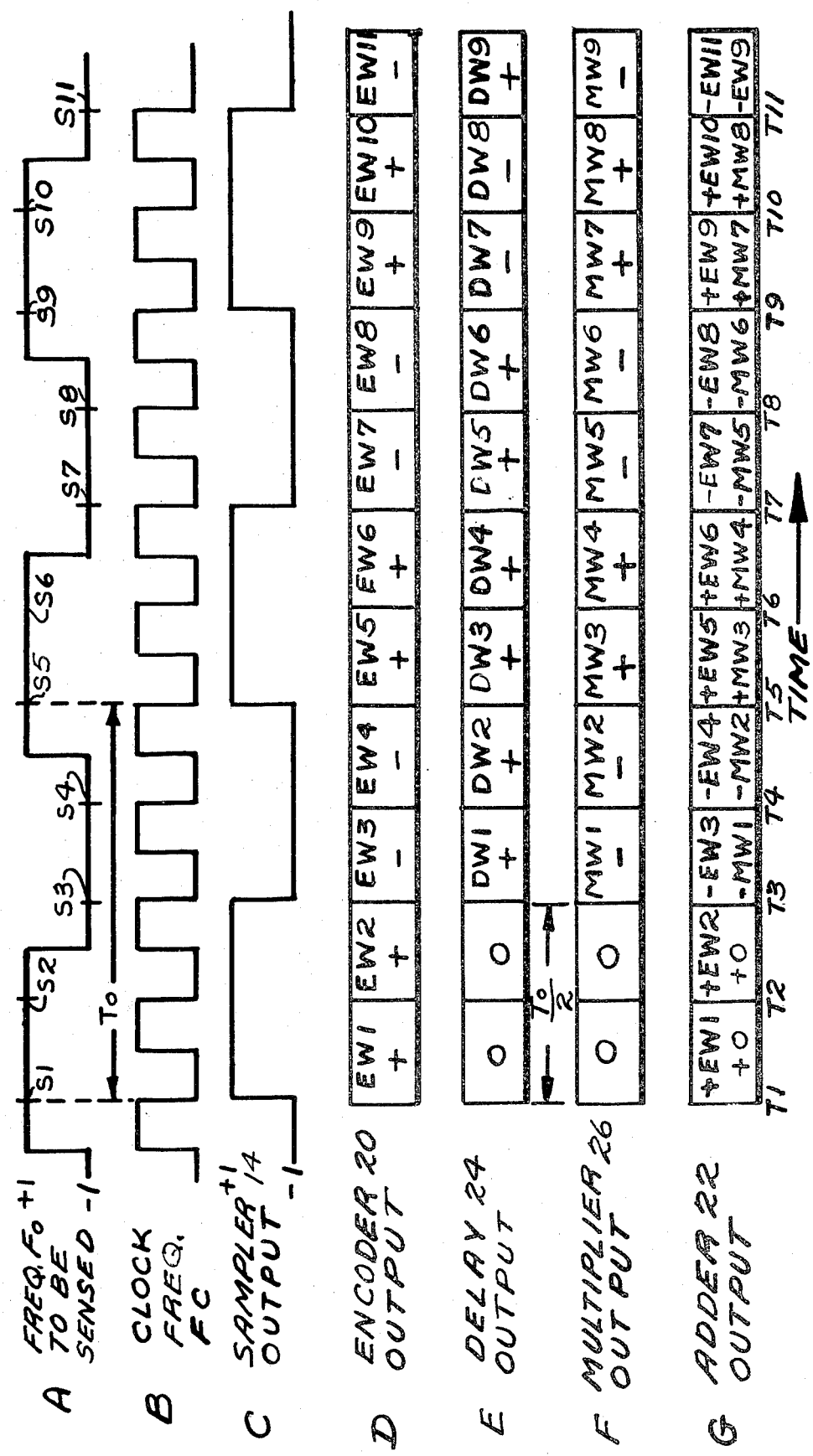
FIGS. 2, 3 and 4 are diagrams illustrating signals at various points within the circuit and illustrating the manipulation of data and signals within the circuit.
Figure 3:
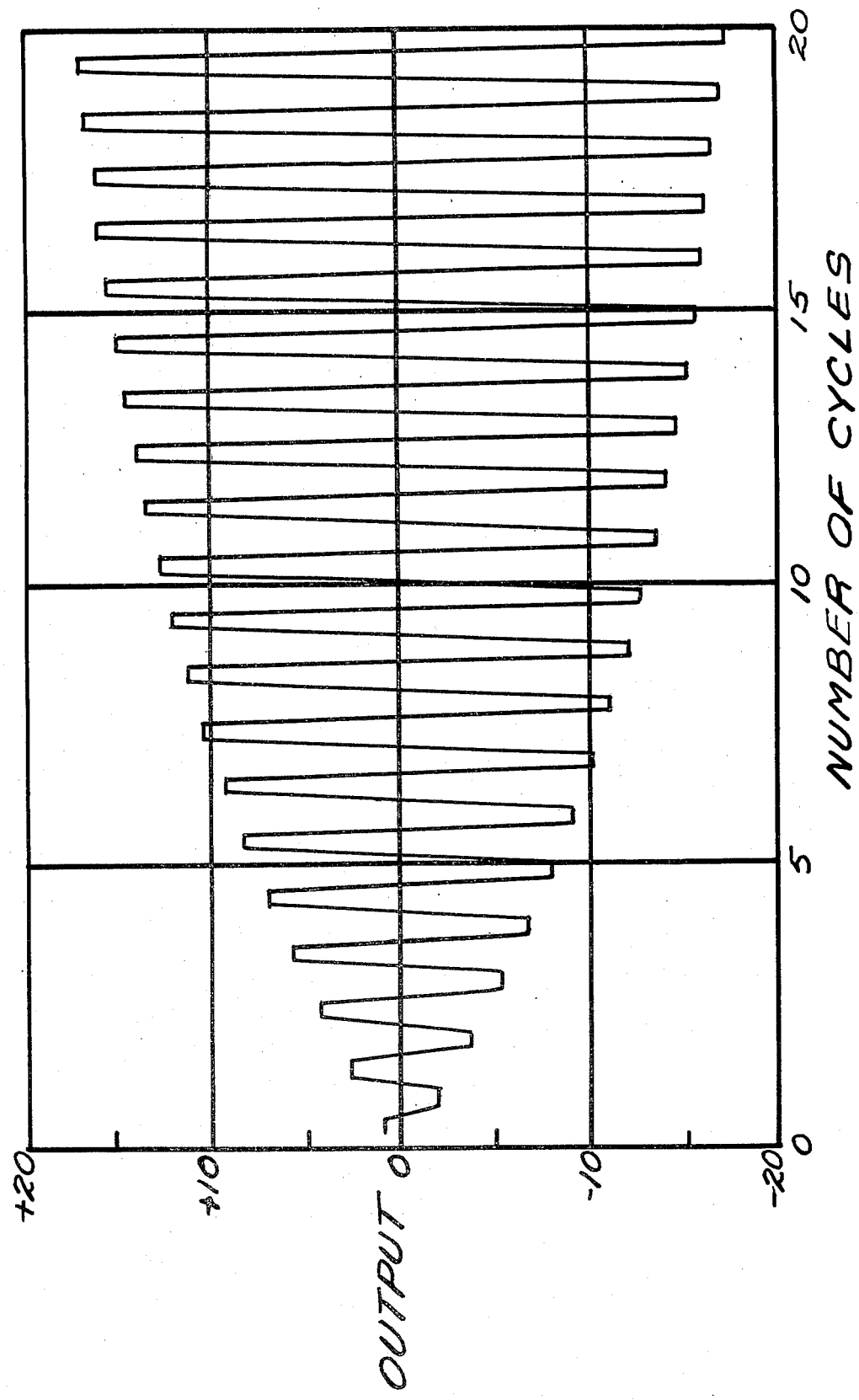
Figure 4:
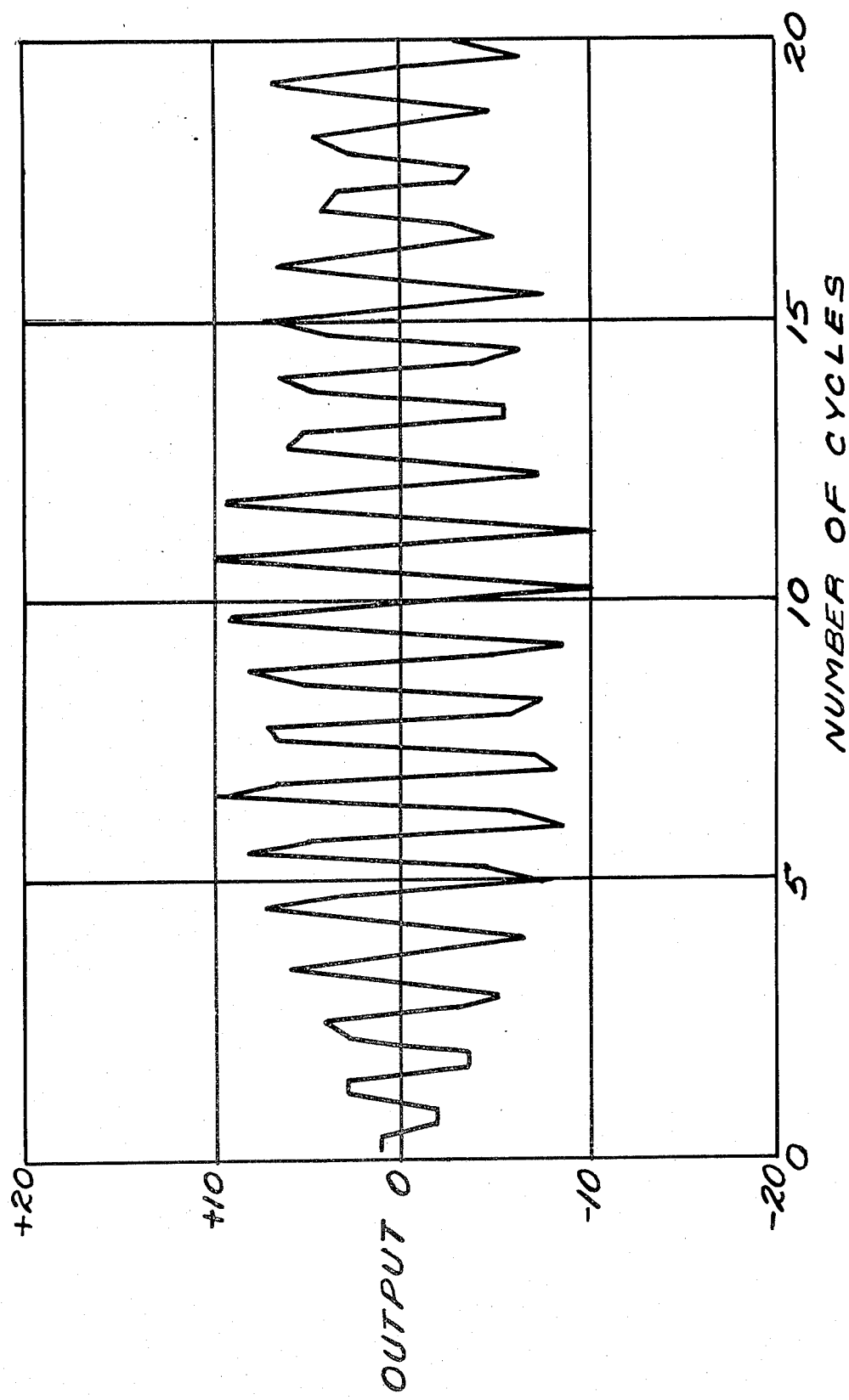

As an example of the operation of the circuit of FIG. 1, specific waveforms and data manipulation are shown in FIGS. 2, 3, and 4. FIG. 2 shows waveforms and information plotted along a common time axis. In this particular example, it is assumed that clock generator 16 provides clock signals (control pulses) at a frequency $F_C$ that is four times the frequency $F_0$ to be sensed. Hence, N is 4.

The frequency $F_0$ to be sensed, after being amplified and limited, is shown in FIG. 2(A), and the clock frequency $F_C$ is shown in FIG. 2(B). Thus, for each cycle of the sensed frequency $F_0$, four amplitude samples are taken. Each sample is taken on the trailing edge of a clock signal, and this is indicated by the designation S followed by a sample number at each appropriate point in FIG. 2(A). For a clock frequency $F_C$ that is four times the frequency $F_0$ to be sensed (N=4), generally two samples will be taken in a positive half cycle and two samples will be taken in a negative half cycle of the frequency $F_0$. These samples are shown in FIG. 2(C). Because of the amplification and limiting, these amplitude samples will have only two values, which can be assumed to be +1.00 or −1.00. These amplitudes are converted by encoder 20 into digital encoded words EW as shown in FIG. 2(D). The number and sign of the samples and words are also indicated. In FIG. 2(D), it should be noted that four encoded words EW are provided for each period $T_0$ of the frequency $F_0$ to be sensed. In other words, N determines the number of encoded words EW produced during a period $T_0$. These encoded words EW are applied to one input of the adder circuit 22. The adder output words AW are shown in FIG. 2(G). These adder output words AW are applied to delay circuit 24 which has M equal to one, so that the delay is $T_0/2$.

The digital delayed words DW from delay circuit 24 are shown in FIG. 2(E), and it will be noted that they are later in time by $T_0/2$. For example, the first sample S1 is taken at time T1, encoded into word EW1 at time T1, and also added at time T1. However, the encoded word EW1 does not appear as delay word DW1 until time T3, since $T1+T_0/2$ equals T3. The same delay (of $T_0/2$ or the time duration of two words) is shown for each word number when FIGS. 2(D) and 2(E) are compared.

The delay words DW are applied to the multiplier circuit 26 which produces multiplier words MW shown in FIG. 2(F). It is assumed that multiplier circuit 26 provides the necessary sign reversal for M equals 1. Thus, delay words DW1+ becomes multiplier words MW1−; delay words DW3− becomes multiplier word MW3+, etc. Multiplier words MW and encoder words EW are added in real time as shown by the adder words AW illustrated in FIG. 2(G). It should be observed that the signs or phases of the added words are always the same because the frequency $F_0$ being sensed is correct for the clock frequency $F_c$ of the generator 16. Thus, words EW and MW applied to adder circuit 22 have an additive or inphase relation which causes adder 22 to produce an output that starts at a relatively low value and approaches maximum positive and negative values as more and more words are added. The maximum values are determined the relation $$\frac{1}{1-|K|},$$

where K is the multiplier constant of multiplier 26.

As $|K|$ approaches unity, the maximum values increase. This is illustrated in FIG. 3 where the incoming frequency equals the desired frequency to be sensed, and where the multiplier constant K is equal to $-0.95$. The maximum value of output approaches $$\frac{1}{1-.95} = 20.$$

Since only twenty (20) cycles are shown, the output has only reached about 17. For all practical purposes, the output would reach 20 by 50 cycles. So, if a threshold detector having a threshold set at about 15 is coupled to the output of the frequency sensing circuit, an accurate indication of the desired frequency will be obtained. For a multiplier constant of $-0.95$, the circuit Q equals $$\frac{90°}{\arc\tan\frac{.05}{1.95}}$$

or approximately 61.

However, if the frequency of the sensed signals is not the desired frequence as determined by the control signal applied to the clock generator 16, the output from digital adder 22 will not approach the maximum value, but will fluctuate up and down in a manner dependent upon the relation of the input signal frequency and the clock generator frequency. Hence, the output of digital adder 22 will never approach the maximum value that would indicate the presence of the desired frequency. This is illustrated in FIG. 4 where the incoming frequency differs from the frequency to be sensed by about 5%, and where the multiplier constant K is $-0.95$. The output varies randomly, and occasionally just reaches a magnitude of 10, so that a threshold of 15 (as mentioned above) would not be reached and frequency $F_o$ would not be sensed. The output from digital adder 22 and from the sensing circuit may be applied to any type of threshold circuit, or may be converted to an analog signal and then applied to a threshold circuit. Either arrangement would provide an indication for the desired frequency being sensed.

For this example, as with any example where N=4, the following equations represent the characteric operation of the circuit.

$$F_O = \frac{F_s}{4}$$

$$BW = \frac{F_s}{\pi} \tan^{-1}\frac{1-|K|}{1+|K|}$$

$$Q = \frac{\pi}{4} \tan^{-1}\frac{1-|K|}{1+|K|}$$

-continued $$A_O = \frac{B}{1-|K|}, \text{ where}$$

$F_s$ = sample frequency in Hz,
$F_0$ = resonant frequency in Hz,
BW = 3dB bandwidth in Hz,
$A_0$ = gain at resonant frequency, and
B = effective scale of encoder 20
K = multiplicative factor of multiplier 26.

Figure 5:
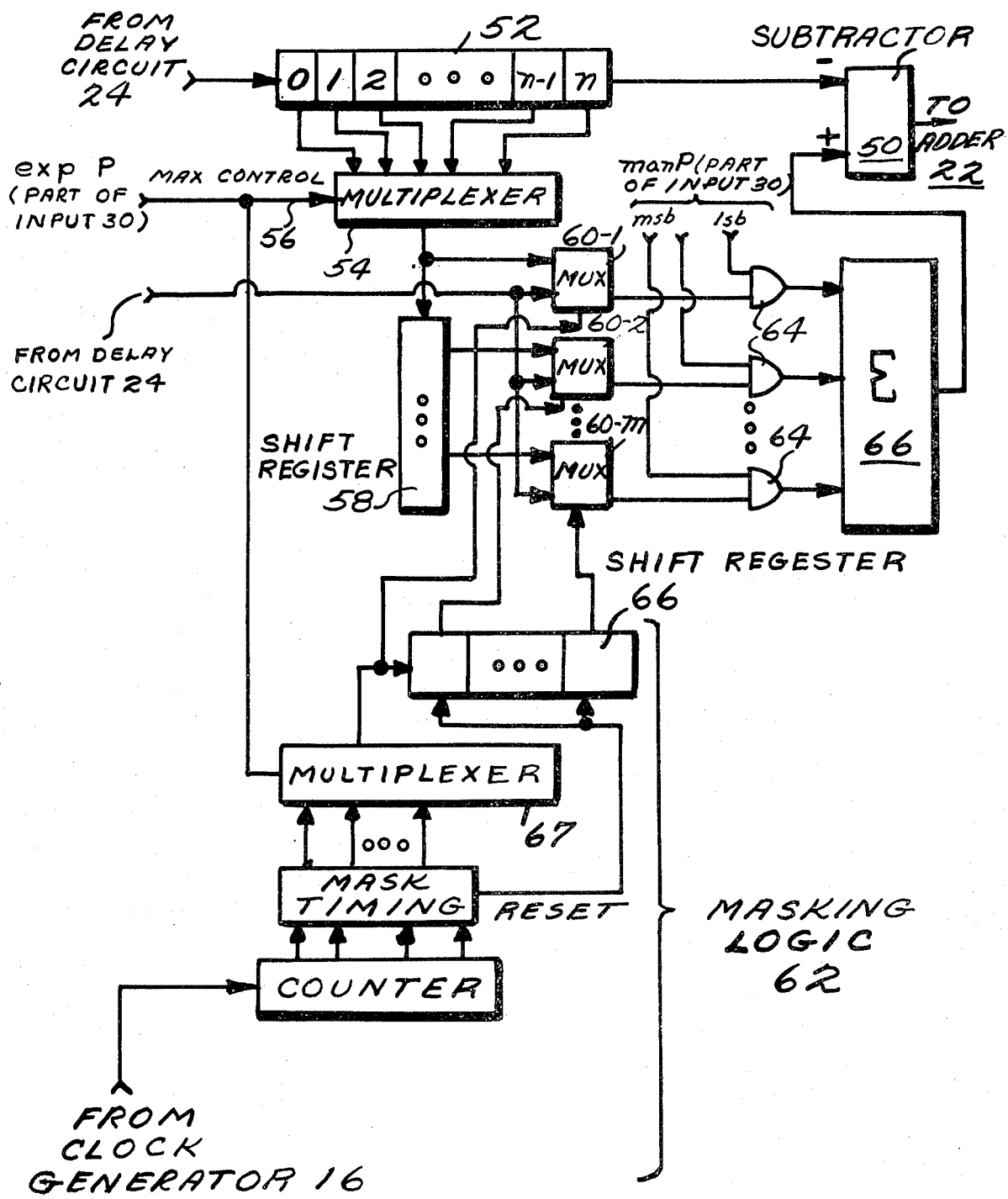
FIG. 5 is a schematic diagram of multiplier 26 shown in FIG. 1.

As previously stated, the value of K can be adjusted or programmed to change the bandwidth (Q) of the circuit. FIG. 5 is a detailed schematic diagram of multiplier 26 showing how such programming can be implemented. For ease in programming and for circuit economy K is expressed as a function of another number P, where K=P−1. The reason for this substitution follows.

Prior art digital filters have suffered two major disadvantages: (1) register overflow, and (2) too large a number of bits in the programming coefficients. By transforming K into a number P that is closer to zero, fewer bits are required in order to carry the same information. The number P is actually used to control multiplier 26. K generally is between $-0.79023438$ and $-0.99511719$. In order to accurately represent the number K in this range, a large number of logic and programming bits would be required. Instead, the coefficient K is transformed by adding 1 to form the P coefficient where P=1+K.

Using this transformation, P is a positive fraction that is close to zero for the range of K set forth above. To maintain accuracy, P is represented in floating point. This floating point representation is useful in controlling the logic of multiplier 26. In order to multiply by K (as is the function of multiplier 26) it is only necessary to multiply by P and then subtract the original value to form the product. This subtraction takes place in subtractor 50 shown in FIG. 5.

To perform the multiplication by P, the floating point coefficient is separated into its mantissa and exponent parts. Thus, P is represented mathematically by $P = \text{manP} \times 2^{-\text{expP}}$ where manP is a normalized (most significant bit is always a 1) m-bit binary fraction and expP is an n-bit binary integer greater than or equal to zero.

The serial output from delay circuit 24 is coupled to the input stage of an n-bit shift register 52 whose outputs are applied to an n-bit multiplexer 54. An input control 56 of multiplexer 54 selects as the output of the multiplexer the n-th shift register stage when expP=0. The output of multiplexer 54 is applied to an n-bit shift register 58. The input and each of the outputs of shift register 58 are applied as inputs to two-input multiplexers 60-1 . . . 60-m. The other input to each of the multiplexers 60 is the sign of the serial input (from delay circuit 24).

Mux control lines from a shift register 66 select outputs from shift register 58 except when masking logic 62 causes the sign to be selected. The sign will be selected when the sign bit from n-bit shift register 58 passes through the two-input mux logic 60. Standard logic using timing derived from a counter is used to provide mask timing signals for this event. The proper signal depends on the selected multiplexer input so that a similar multiplexer 67 selects the correct mask timing signal, which is then applied to m-bit shift register 66. The output of multiplexers 60 are gated by gates 64 to a summer 66. The output of summer 66 is coupled to the (+) input of subtractor 50. The output of subtractor 50 serves as the serial output of multiplexer 26 coupled to adder 22.

As a specific arithmetic example of the operation control of multiplier 26, assume its serial input to be 0.40234375 (base 10). The value of K desired is −0.6875 (base 10) which is equivalent to 1.010100 in base 2. P=1+K=0.3125 (base 10) which is equivalent to 0.01010000 in base 2. P is defined as $P = manP \times 2^{-expP}$. Thus, manP=0.625 (base 10) which is equivalent to 0.101 in base 2, and expP=2 (base 10) which is equivalent to 010 in base 2.

($P = 0.625_{10} \times 2^{-2} = 0.3125$)

A detailed schematic diagram of encoder 20 is shown in FIG. 6. As previously stated, when the value of K of multiplier 26 is adjusted to alter the bandwidth of the circuit, it is necessary to adjust the scale of encoder 20. This scale adjustment is accomplished through input 32 providing the values of expP and manP (which are related to K as discussed above).

The magnitude of the words in delay circuit 24 reach a maximum at the center design frequency. Its maximum valve is related to the magnitude of the encoder words. The values are related as follows:

$$\text{MAX VALUE IN DELAY CIRCUIT 24} = \frac{\text{Encoder Word Magnitude}}{1 - |K|} = \frac{\text{Encoder Magnitude}}{P}$$

By making the magnitude of the encoded word also equal to P, the maximum level in the delay register is also unity regardless of the circuit Q (programmed by K). Clock pulses of $2^s F_c$ are applied to an S-bit counter 80 having an output 82 of 1 bit for every $2^s$ pulses counted. Since the encoder is serial the clock must be $2^s$ higher in frequency where $2^s$ is the number of binary bits in a word. The output of the counter 80 is applied to a S bit binary adder 84 which also has the expP word applied. If expP is less than S bits the high order bits are zero. The adder output is applied to the address port of an $2^s$ bit multiplexer 86. The data input of the multiplexer is driven by the manP word. The most significant bit manP is applied to the lowest addressed bit of multiplexer 86. Unused inputs are zeroed. The multiplexer serial output is applied to an exclusive-OR gate 88 with the output of a sample f/f 90 coupled to the output of sampler 14 to cause sign changes to occur.

Therefore there has been provided a new and improved digital frequency sensing circuit that is relatively simple, and that uses known components or circuit elements in a unique and improved arrangement. Previous digital frequency sensing circuits required two or more feedback arrangements which complicated the frequency sensing circuit and made it relatively difficult to control or program the clock generator 16 and the fractional multipliers which were needed. While only the presently contemplated preferred embodiment of the frequency sensing circuit has been described persons skilled in the art will appreciate that it can be used as a frequency sensing or bandpass filter circuit for almost any frequency. The digital words may be formed of series bits or parallel bits, depending upon circuit requirements and preferences. Various digital codes may be used. The number of significant digits forming each word may be varied, depending upon the accuracy desired. The clock generator 16 may be operated at any integral multiple of two or more times the frequency $F_0$ to be sensed; the delay circuit 24 may be operated at any integral multiple of one-half the period $T_0$ of the frequency to be sensed; and the multiplier 26 may utilize any fractional or decimal multiplication depending upon the circuit Q and maximum output desired or needed. Therefore, while the invention has been described with reference to the particular embodiment shown, it is to be understood that modifications may be made without departing from the spirit and scope of the invention or from the scope of the claims. Other alternative embodiments and modifications of the present invention will be apparent to those of ordinary skill in the art having the benefit of the teachings presented in the foregoing description and drawings. It is therefore to be understood that this invention is not to be unduly limited and such modifications are intended to be included within the scope of the appended claims.

What is claimed is:

1. A frequency sensing circuit comprising:
   means for sampling an input signal;
   means coupled to said means for sampling, for encoding each sample as a digital signal at an output thereof;
   an adder having a first input coupled to the output of said means for encoding and having a second input and an output;
   delay means having an input coupled to the output of said adder for delaying signals applied thereto by an amount that is approximately an integral multiple of one-half the time period of the frequency to be sensed, said delayed signals being provided at an output;
   a multiplier having an input coupled to the output of said delay means and having an output coupled to said second input of said adder;
   means for clocking said multiplier at a rate of two or more times the desired frequency to be sensed; and
   means coupled to said frequency sensing circuit for deriving an output signal therefrom having a magnitude indicative of the presence of the frequency to be sensed in said input signal.

2. A frequency sensing circuit according to claim 1 wherein said means for sampling comprises means for sampling at a rate that is N times the desired frequency to be sensed.

3. A frequency sensing circuit according to either of claims 1 or 2 wherein N is four.

4. A frequency sensing circuit according to either of claims 1 or 2 wherein said delay means comprises a digital circuit clocked by said means for clocking.

5. A frequency sensing circuit according to claim 4 wherein N is four.

6. A frequency sensing circuit according to either of claims 1 or 2 wherein said delay means provides signals to said second input of said adder that are in phase with signals applied to said first input of said adder.

7. A frequency sensing circuit according to claim 6 wherein N is four.

8. A frequency sensing circuit according to claim 4 wherein said delay means provides signals to said second input of said adder that are in phase with signals applied to said first input of said adder.

9. A frequency sensing circuit according to claim 1 wherein said means for sampling includes means for adjusting the rate of sampling of said means for sampling.

10. A frequency sensing circuit according to claim 2 wherein said means for clocking is adjustable.

11. A frequency sensing circuit according to claim 1 wherein the means for clocking comprises means for clocking said multiplier at a rate of N times the desired frequency to be sensed where N is any integer greater than 1.

12. A frequency sensing circuit according to claim 1 wherein said output deriving means is coupled to said adder.

13. A frequency sensing circuit according to claim 1 wherein said output deriving means is coupled to said delay means.

14. A frequency sensing circuit for sensing the presence of a frequency component $F_O$ in an applied analog signal comprising:
   means for limiting the applied analog signal to produce an amplitude limited signal;
   means for sampling the amplitude limited signal;
   means coupled to said means for sampling, for encoding each sample as a digital signal at an output thereof;
   an adder having a first input coupled to the output of said means for encoding and having a second input and an output;
   delay means having an input coupled to the output of said adder for delaying signals applied thereto by an amount that is an integral multiple of one-half the time period of the frequency to be sensed said delayed signals being provided at an output;
   a multiplier having an input coupled to the output of said delay means and having an output coupled to said second input of said adder;
   means for clocking said multiplier at a rate of two or more times the desired frequency to be sensed; and
   means coupled to said frequency sensing circuit for deriving an output signal therefrom having a magnitude indicative of the presence of the frequency to be sensed in said input signal.

15. A frequency sensing circuit according to claim 11 wherein said means for sampling includes means for sampling at a rate that is N times the desired frequency to be sensed.

16. A frequency sensing circuit according to either of claims 14 or 15 wherein N is four.

17. A frequency sensing circuit according to either of claims 14 or 15 wherein said delay means comprises a digital circuit clocked by said means for clocking.

18. A frequency sensing circuit according to either of claims 14 or 15 wherein said delay means provides signals to said second input of said adder that are in phase with signals applied to said first input of said adder.

19. A frequency sensing circuit according to claim 17 wherein said delay means provides signals to said second input of said adder that are in phase with signals applied to said first input of said adder.

20. A frequency sensing circuit according to claim 14 wherein the means for clocking comprises means for clocking said multiplier at a rate of N times the desired frequency to be sensed where N is any integer greater than 1.

21. A frequency sensing circuit according to claim 14 wherein said output deriving means is coupled to said adder.

22. A frequency sensing circuit according to claim 14 wherein said output deriving means is coupled to said delay means.

23. A frequency sensing circuit for sensing the presence of a frequency component $F_0$ in an applied signal, comprising:
   means for sampling said applied signal at a rate of $NF_0$, where N is any integer of two or more;
   an adder having first and second inputs and an output, said first input of said adder coupled to said means for sampling;
   a feedback circuit coupling said output to said second input of said adder, said feedback circuit including delay means and a multiplier coupled in series, said delay means providing a time delay of an integral number of periods $\frac{1}{2}F_0$ corresponding to the frequency to be sensed and said multiplier multiplying signals in said feedback circuit by a number less than one and greater than zero; and
   means coupled to said frequency sensing circuit for deriving an output signal therefrom having a magnitude indicative of the frequency sensed.

24. A frequency sensing circuit according to claim 23 wherein N is at least four, and wherein the integral number of periods of delay $\frac{1}{2}F_0$ provided by said delay means is one, and wherein said feedback circuit changes the sign of the signals coupled from the output of said adder to its second input.

25. A frequency sensing circuit according to claim 17 wherein N is at least four, and wherein said integral number of periods of delay $\frac{1}{2}F_0$ provided by said delay means is two.

26. A frequency sensing circuit according to any of claims 17, 18 and 19 wherein said adder and said feedback circuit are digital circuits.

27. A frequency sensing circuit according to any of claims 23, 24 and 25 wherein said feedback circuit provides signals to said second input of said adder that are in phase with the signals applied to its first input.

28. A frequency sensing circuit according to claim 20 wherein said feedback circuit provides signals to said second input of said adder that are in phase with signals applied to its first input.

29. A frequency sensing circuit according to claim 23 wherein said output deriving means is coupled to said adder.

30. A frequency sensing circuit according to claim 23 wherein said output deriving means is coupled to said delay means.

31. A circuit for sensing the presence of a frequency component $F_0$ in an input signal comprising:
   a clock providing clock signals at a rate of N times the frequency $F_0$ to be sensed, where N is any integer greater than one;
   means, coupled to said clock, for sampling said input signal and providing an amplitude sample of said input signal for each clock signal;
   an adder having a first input for receiving said amplitude samples, a second input and an output;
   feedback means coupling the output of said adder to its seconds input, said feedback means consisting of:
   (a) delay means for providing a delay of one-half the time period $T_0$ of said frequency $F_0$;
   (b) a multiplier for multiplying signal magnitudes by a multiplier constant that it less than one and greater than zero; and
   (c) means coupling said delay means and said multiplier in series; and means coupled to said frequency sensing circuit for deriving an output signal therefrom having a magnitude indicative of the frequency sensed.

32. A circuit according to claim 31 wherein said clock is adjustable.

33. A circuit according to either of claims 18 or 31 wherein said feedback means further includes means for changing the sign of signals coupled therethrough.

34. A circuit according to either of claims 18 or 31 further comprising a digital encoder coupled between the output of said means for sampling and said first input of said adder.

35. A circuit according to either of claims 31 or 32 wherein said adder, said delay means, and said multiplier comprise binary digital circuits.

36. A circuit according to claim 31 wherein said feedback means provides signals to said second input of said adder that are in phase with signals applied to said first input of said adder.

37. A circuit according to claim 32 wherein said feedback means provides signals to said second input of said adder that are in phase with signals applied to said first input of said adder.

38. A circuit according to claim 33 wherein said feedback means provides signals to said second input of said adder that are in phase with signals applied to said first input of said adder.

39. A circuit according to claim 34 wherein said feedback means provides signals to said second input of said adder that are in phase with signals applied to said first input of said adder.

40. A circuit according to claim 35 wherein said feedback means provides signals to said second input of said adder that are in phase with signals applied to said first input of said adder.

41. A frequency sensing circuit according to claim 31 wherein said output deriving means is coupled to said adder.

42. A frequency sensing circuit according to claim 31 wherein said output deriving means is coupled to said delay means.

43. A frequency sensing circuit comprising:
 means for sampling an input signal;
 means, coupled to said means for sampling, for digitally encoding the magnitude of each sample;
 an adder having a first input coupled to said means for encoding and having a second input and an output;
 delay means having an input coupled to the output of said adder, said delay means providing a delay that is an integral multiple of one-half of the period corresponding to the frequency to be sensed;
 a multiplier having a multiplier constant K and having an input coupled to the output of said delay means and having an output coupled to the second input of said adder, said multiplier clocked at a rate of N times the desired frequency to be sensed, where N is any integer greater than 1, said multiplier constant K being controllable and determining the bandwidth of the frequency sensitive circuit; and
 means coupled to said frequency sensing circuit for deriving an output signal therefrom having a magnitude indicative of the frequency sensed.

44. A frequency sensing circuit according to claim 43 wherein said multiplier constant K is responsive to control signals applied to said multiplier.

45. A frequency sensing circuit according to claim 44 wherein said control signals include signals representing expP and manP, where $P = K + 1$, and $P = manP \times 2^{-expP}$ 46. A frequency sensing circuit according to claim 45 wherein said multiplier comprises:
 a first shift register having an input coupled to the output of said delay means;
 a first multiplexer coupled to each stage of said shift register, said first multiplexer controlled by said expP signal;
 a second shift register coupled to the output of said first multiplexer;
 a second multiplexer coupled to each stage of said second shift register;
 logic means, controlled by said manP signal for gating the outputs of said second multiplexer;
 a summer coupled to the outputs of said logic means; and
 a subtracter for subtracting the input signal to said multiplier from the output of said summer.

47. A frequency sensitive circuit according to claim 45 wherein said means for encoding provides a scale factor to the encoded samples EW, said scale factor being controllable by said expP and manP signals.

48. A frequency sensing circuit according to claim 43 wherein said output deriving means is coupled to said adder.

49. A frequency sensing circuit according to claim 43 wherein said output deriving means is coupled to said delay means.

* * * * *

UNITED STATES PATENT OFFICE
CERTIFICATE OF CORRECTION

Patent No. 4,351,032    Dated September 21, 1982

Inventor(s) Richard F. Challen

It is certified that error appears in the above-identified patent and that said Letters Patent are hereby corrected as shown below:

Col. 1, line 22, cancel "component" and insert -- components --
Col. 7, line 24, cancel "valve" and insert -- value --
Col. 9, line 41, patent claim 15 should be dependent on patent claim 14
Col. 10, line 27, patent claim 25 should be dependent on patent claim 23
Col. 10, line 32, patent claim 26 should be dependent on patent claims 23, 24 and 25
Col. 10, line 38, patent claim 28 should be dependent on patent claim 26
Col. 11, line 6, patent claim 33 should be dependent on patent claims 31 or 32
Col. 11, line 9, patent claim 34 should be dependent on patent claims 31 or 32

Signed and Sealed this

Twenty-second Day of February 1983

[SEAL]

Attest:

GERALD J. MOSSINGHOFF

Attesting Officer    Commissioner of Patents and Trademarks